US010783955B2

(12) United States Patent
Fujiwara et al.

(10) Patent No.: US 10,783,955 B2
(45) Date of Patent: Sep. 22, 2020

(54) MEMORY CIRCUIT HAVING SHARED WORD LINE

(71) Applicant: TAIWAN SEMICONDUCTOR MANUFACTURING COMPANY, LTD., Hsinchu (TW)

(72) Inventors: Hidehiro Fujiwara, Hsinchu (TW); Li-Wen Wang, Taichung (TW); Yen-Huei Chen, Jhudong Township (TW); Hung-Jen Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/207,030

(22) Filed: Nov. 30, 2018

(65) Prior Publication Data

US 2019/0103158 A1 Apr. 4, 2019

Related U.S. Application Data

(60) Continuation of application No. 15/251,260, filed on Aug. 30, 2016, now Pat. No. 10,163,491, which is a division of application No. 14/459,094, filed on Aug. 13, 2014, now Pat. No. 9,449,667.

(60) Provisional application No. 61/972,917, filed on Mar. 31, 2014.

(51) Int. Cl.
| H01L 27/11 | (2006.01) |
| G11C 11/419 | (2006.01) |
| G11C 11/418 | (2006.01) |
| H01L 27/02 | (2006.01) |
| G11C 8/14 | (2006.01) |

(52) U.S. Cl.
CPC .............. *G11C 11/419* (2013.01); *G11C 8/14* (2013.01); *G11C 11/418* (2013.01); *H01L 27/0207* (2013.01); *H01L 27/1116* (2013.01)

(58) Field of Classification Search
CPC ........................................................ G11C 8/14
USPC ........................................................... 365/51
See application file for complete search history.

(56) References Cited

U.S. PATENT DOCUMENTS

| 5,051,952 | A | 9/1991 | Gotou |
| 6,266,263 | B1 | 7/2001 | Lien et al. |
| 6,552,923 | B2 | 4/2003 | Houston |
| 6,778,462 | B1 | 8/2004 | Castagnetti |
| 9,449,667 | B2* | 9/2016 | Fujiwara ................ G11C 8/14 |
| 10,163,491 | B2* | 12/2018 | Fujiwara ................ G11C 8/14 |
| 2005/0213360 | A1 | 9/2005 | Park et al. |
| 2005/0264323 | A1* | 12/2005 | Nakazato ............ H03F 3/45188 327/51 |
| 2006/0098499 | A1* | 5/2006 | Joshi .................... G11C 8/08 365/189.08 |
| 2007/0234263 | A1 | 10/2007 | Cox et al. |
| 2007/0279966 | A1 | 12/2007 | Houston |
| 2009/0059640 | A1 | 3/2009 | Funane et al. |

(Continued)

*Primary Examiner* — Min Huang
(74) *Attorney, Agent, or Firm* — Hauptman Ham, LLP

(57) ABSTRACT

A circuit includes a column of memory cells, a first read data line coupled exclusively with a first subset of memory cells of the column of memory cells, a second read data line coupled exclusively with a second subset of memory cells of the column of memory cells, and a plurality of read word lines. Each read word line of the plurality of read word lines is coupled with a memory cell of the first subset of memory cells and with a memory cell of the second subset of memory cells.

18 Claims, 12 Drawing Sheets

(56) References Cited

U.S. PATENT DOCUMENTS

| | | |
|---|---|---|
| 2009/0141528 A1 | 6/2009 | Arsovski |
| 2009/0207642 A1 | 8/2009 | Shimano et al. |
| 2009/0244950 A1* | 10/2009 | Nii .......................... G11C 7/18 |
| | | 365/63 |
| 2012/0147680 A1 | 6/2012 | Koike |
| 2012/0206969 A1* | 8/2012 | Gu .................... H01L 21/28273 |
| | | 365/185.18 |
| 2013/0077375 A1 | 3/2013 | Liaw |
| 2013/0148415 A1 | 6/2013 | Shu |
| 2013/0194882 A1 | 8/2013 | Ishii |
| 2013/0201766 A1 | 8/2013 | Feki |
| 2014/0097481 A1 | 4/2014 | La Rosa et al. |
| 2014/0286096 A1* | 9/2014 | Chong .................... G11C 7/18 |
| | | 365/185.06 |
| 2015/0302917 A1 | 10/2015 | Grover et al. |
| 2016/0064067 A1 | 3/2016 | Mojumder et al. |

* cited by examiner

MEMORY CIRCUIT HAVING SHARED WORD LINE

CLAIM OF PRIORITY

The present application is a continuation of U.S. application Ser. No. 15/251,260, filed Aug. 30, 2106, which is a divisional of U.S. application Ser. No. 14/459,094, filed on Aug. 13, 2014, now U.S. Pat. No. 9,449,667, issued Sep. 20, 2016, which claims priority to U.S. Provisional Patent Application No. 61/972,917, filed on Mar. 31, 2014, the disclosures of which are incorporated herein by reference in their entireties.

BACKGROUND

The semiconductor integrated circuit (IC) industry has experienced rapid growth. Technological advances in IC materials and design have produced generations of ICs, where each generation has smaller and more complex circuits than the previous generation. In the course of integrated circuit evolution, functional density (i.e., the number of interconnected devices per chip area) has generally increased while geometry size (i.e., the smallest component or line that can be created using a fabrication process) has decreased. When the width of a conductive line becomes smaller, the unit-length resistance of the conductive line becomes greater, and vice versa. In some applications, a digital signal transmitted on a conductive line has a longer rising or falling time when the unit-length resistance thereof becomes greater. In other words, the unit-length resistance of a conductive line limits an operating frequency of a digital signal transmitted thereon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
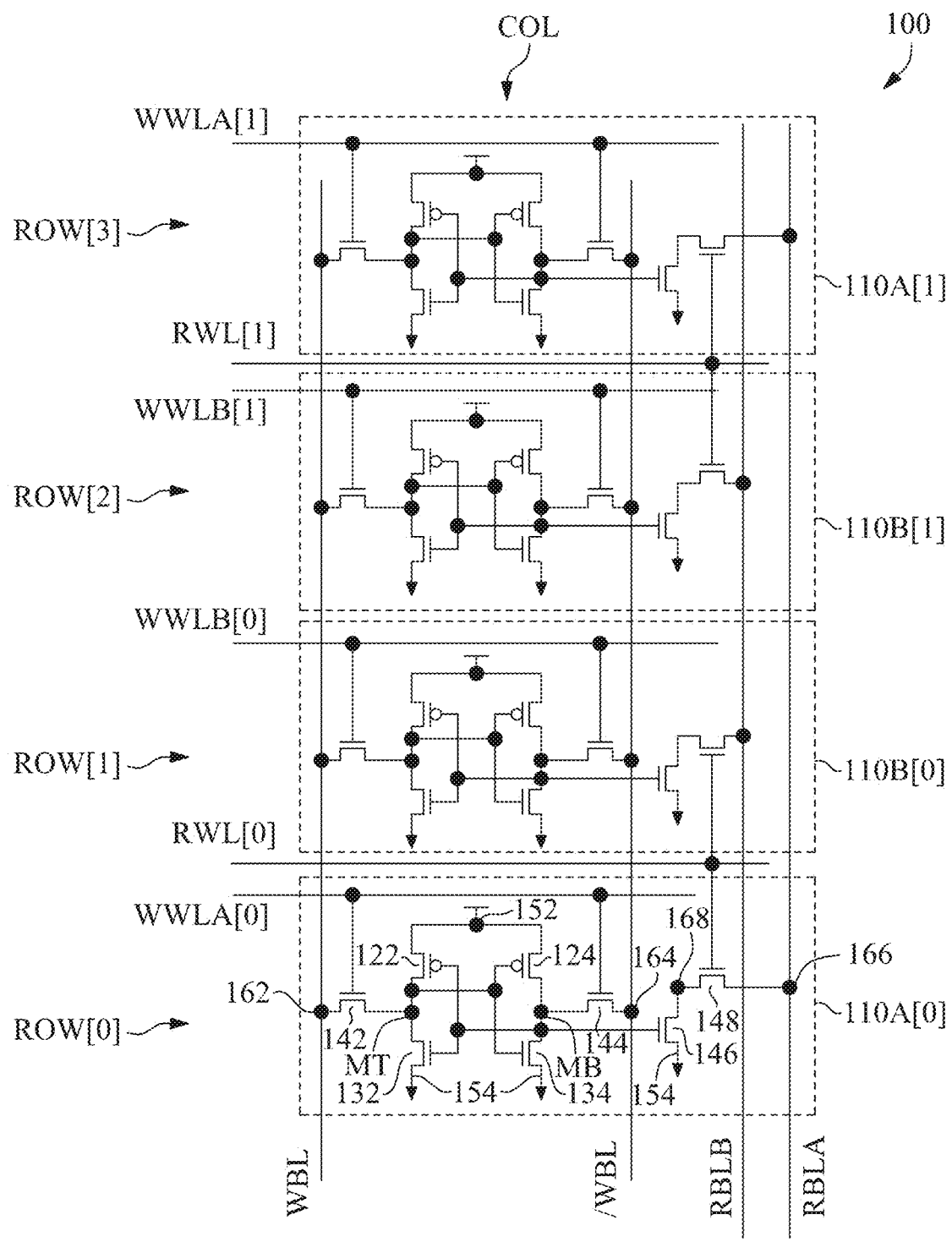
FIG. 1 is a circuit diagram of a portion of a memory circuit in accordance with some embodiments.

The following disclosure provides many different embodiments, or examples, for implementing different features of the invention. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is related to a word line and/or bit line routing scheme usable to reduce word line resistance and, in at least some embodiments, to facilitate a faster operation. For example, in some technology nodes, the performance of a static random access memory (SRAM) circuit is limited by the resistance of word lines of the SRAM circuit. In some embodiments, the word lines of a memory circuit according to one or more embodiments of the present disclosure has reduced resistance than that having a different configuration, and an operating frequency of the memory circuit is thus improved.

FIG. 1 is a circuit diagram of a portion of a memory circuit 100 in accordance with some embodiments. Memory circuit 100 includes a plurality of memory cells arranged into columns and one or more pairs of adjacent rows. A pair of adjacent rows refers to two rows of memory cells without any intermediate row of memory cells therebetween. For example, FIG. 1 depicts that memory circuit 100 includes memory cells 110A[0], 110B[0], 110A[1], and 110B[1], which belong to a column COL. Also, memory cell 110A[0] belongs to a first row ROW[0]; memory cell 110B[0] belongs to a second row ROW[1]; memory cell 110A[1] belongs to a third row ROW[2]; and memory cell 110B[1] belongs to a fourth row ROW[3]. In some embodiments, memory circuit 100 includes two or more columns of memory cells. In some embodiments, memory circuit 100 includes four or more rows of memory cells. Other memory cells in rows ROW[0], ROW[1], ROW[2], and ROW[3], which correspond to columns other than column COL, are not shown in FIG. 1.

Memory cells 110A[0], 110B[0], 110A[1], and 110B[1] are two-port-eight-transistor (2P-8T) SRAM cells. A two-port memory cell includes a write port and a read port. The read port includes a read data line that is configured to carry the data read from the memory cell through a read pass gate. The read pass gate is controlled by a read word line signal. The write port includes a write data line that is configured to carry the data to be written to the memory cell through one or more write pass gates. The one or more write pass gates are controlled by a write word line signal.

For example, memory cell 110A[0], illustrated as a representative memory cell, includes two P-type transistors 122 and 124 and two N-type transistors 132 and 134 forming a storage unit, another two N-type transistors 142 and 144 as a part of the write port of memory cell 110A[0], and another two N-type transistors 146 and 148 as a part of the read port of memory cell 110A[0]. The write port is further associated with write word line WWLA[0] and write bit lines WBL and /WBL. The read port is further associated with read word line RWL[0] and read bit line RBLA. Memory cell 110A[0] further includes two power supply nodes 152 and 154. Power supply node 152 is configured to have a first power supply voltage level corresponding to a logical high value. Power supply node 154 is configured to have a second power supply voltage level corresponding to a logical low value.

Transistors 122, 124, 132, and 134 form a pair of cross-coupled inverters between power supply nodes 152 and 154. Transistors 122 and 132 form a first inverter while transistors 124 and 134 form a second inverter. Drains of transistors 122 and 132 are coupled together and form a data node MT. Drains of transistors 124 and 134 are coupled together and form a data node MB. Gates of transistors 122 and 132 are coupled together and to drains of transistors 124 and 134. Gates of transistors 124 and 134 are coupled together and to drains of transistors 122 and 132.

Transistor 142 is coupled with bit line WBL at an access node 162 and with data node MT. Transistor 144 is coupled between bit line /WBL at an access node 164 and with data node MB. Write word line WWLA[0] is coupled with gates of transistors 142 and 144. In some embodiments, bit lines WBL, /WBL, and RBLA are also shared by other memory cells in column COL. Transistors 142 and 144 function as pass gates controlled by write word line WWLA[0]. In some embodiments, write word line WWLA[0] is also coupled with gates of transistors corresponding to transistors 142 and 144 in other memory cells in row ROW[0].

In some embodiments, memory circuit 100 includes a plurality of write data lines each being coupled to access nodes corresponding to access node 162 of the corresponding column of the columns of memory cells, and a plurality of write data lines each being coupled to access nodes corresponding to access node 164 of the corresponding column of the columns of memory cells.

Write word line WWLA[0] is also called a write control line because the signal on write word line WWLA[0] controls transistors 142 and 144 for data on write bit lines WBL and /WBL to be written to corresponding nodes MT and MB.

When memory cell 110A[0] is accessed for a write operation, data to be written to memory cell 110A[0] is applied to write bit lines WBL and /WBL. Write word line WWLA[0] is then activated, such as being set to have the logical high value, to turn on transistors 142 and 144. As a result, the data on bit lines WBL and /WBL is transferred to and is stored in corresponding data nodes MT and MB.

Transistor 146 has a source coupled to power supply node 154, a gate coupled to data node MB, and a drain coupled to transistor 148. Transistor 146 is configured to be turned off when the gate of transistor 146 has a voltage level corresponding to the logical low value, and to be turned on when the gate of transistor 146 has a voltage level corresponding to the logical high value. Transistor 146 functions as a pulling device configured to selectively couple the intermediate node 168 to the power supply node 154 responsive to the voltage level at data node MB.

Transistor 148 is coupled with read bit line RBLA at an access node 166 and with the drain of transistor 146. Read word line RWL[0] is coupled with a gate of transistor 148. Transistor 148 functions as a read pass gate controlled by read word line RWL[0]. In some embodiments, read word line RWL[0] is also coupled with gates of transistors corresponding to transistor 148 in other memory cells in row ROW[0].

When memory cell 110A[0] is accessed for a read operation, read bit line is precharged to a voltage level corresponding to the logical high value. Then, read word line RWL[0] is activated, such as being set to have the logical high value, to turn on transistor 148, and the drain of transistor 146 and read bit line RBLA are electrically coupled together at an intermediate node 168. If data node MB has a voltage level corresponding to the logical low value, transistor 146 is turned off and read bit line RBLA remains at a logical high level. If data node MB has a voltage level corresponding to the logical high value, transistor 146 is turned on and pull read bit line RBLA toward the voltage level at the power supply node 154. Thus, transistor 148, working in conjunction with transistor 146, is configured to selectively alter a voltage level at access node 166 according to a voltage level at the data node MB if transistor 148 is turned on.

Memory cells 110B[0], 110A[1], and 110B[1] have configurations similar to that of memory cell 110A[0], and description thereof is thus omitted.

Rows ROW[0], ROW[1], ROW[2], and ROW[3] are divided into mutually-exclusive groups of rows, where each group includes a pair of immediately adjacent rows of memory cells. For example, the rows ROW[0] and ROW[1] are grouped together, and rows ROW[2] and ROW[3] are grouped together. Memory cells of rows ROW[0] and ROW[1] share a common read word line RWL[0]. Memory cells of rows ROW[2] and ROW[3] share a common read word line RWL[1].

Also, each row of the plurality rows of memory cells is coupled with a corresponding write word line. For example, memory cells of row ROW[0] is coupled with a write word line WWLA[0]; memory cells of row ROW[1] is coupled with a write word line WWLB[0]; memory cells of row ROW[2] is coupled with a write word line WWLB[1]; and memory cells of row ROW[3] is coupled with a write word line WWLA[1].

Each group of rows includes a row identifiable as the "A" row and a row identifiable as the "B" row. Read ports of the memory cells in the same column that belong to the "A" rows are coupled to a first read word line RBLA. Read ports of memory cells in the same column that belong to the "B" rows are coupled to a second read bit line RBLB. In some embodiments, memory circuit 100 has a plurality of "A" read data lines each being coupled to an "A" subset of the access nodes of a corresponding column of the columns of memory cells, and a plurality of "B" read data lines each being coupled to a "B" subset of the access nodes of the corresponding column. The "A" subset of the access nodes and the "B" subset of the access nodes are mutually exclusive.

For example, in the group including rows ROW[0] and ROW[1], row ROW[0] is identified as the "A" row, and row ROW[1] is identified as the "B" row. Also, in the group including rows ROW[2] and ROW[3], row ROW[3] is identified as the "A" row, and row ROW[2] is identified as the "B" row. Thus, memory cells 110A[0] and 110A[1] that belong to both column COL and identifiable as "A" rows are coupled with read word line RBLA, and memory cells 110B[0] and 110B[1] that belongs to both column COL and identifiable "B" rows are coupled with read bit line RBLB.

Therefore, when a read word line, such as read word line RWL[0], is activated to access a memory cell, such as memory cell 110A[0], read pass gates of memory cell 110B[0] is also turned on. Because memory cell 110A[0] and memory cell 110B[0] have different read bit lines RBLA and RBLB, the read operation to access memory cell 110A[0] is not interfered by the read pass gate of memory cell 110B[0], and vice versa. In some embodiments, only one of the read bit lines RBLA and RBLB is coupled to a sensing circuit for outputting the data stored in a corresponding memory cell 110A[0] or 110B[0] at a time. In some embodiments, read bit lines RBLA and RBLB are coupled to corresponding sensing circuits for outputting the data stored in memory cell 110A[0] and memory cell 110B[0] at the same time. In contrast, write ports of memory cells in the same column, including those belong to the "A" rows and "B" rows, are coupled to the same pair of write bit lines WBL and /WBL.

Therefore, for every two consecutive rows of memory cells, there are only three electrically distinct word lines. For example, rows ROW[0] and ROW[1] have three word lines RWL[0], WWLA[0], and WWLB[0]; and rows ROW[2] and ROW[3] have three word lines RWL[1], WWLA[1], and WWLB[1]. Compared with a configuration that has four electrically distinct word lines for every two consecutive rows of memory cells, the circuit of FIG. 1 has word lines, such as WWLA[0], WWLB[0], and RWL[0] for rows ROW[0] and ROW[1], that are suitable to have widened widths and thus reduced line resistance.

Figure 2:
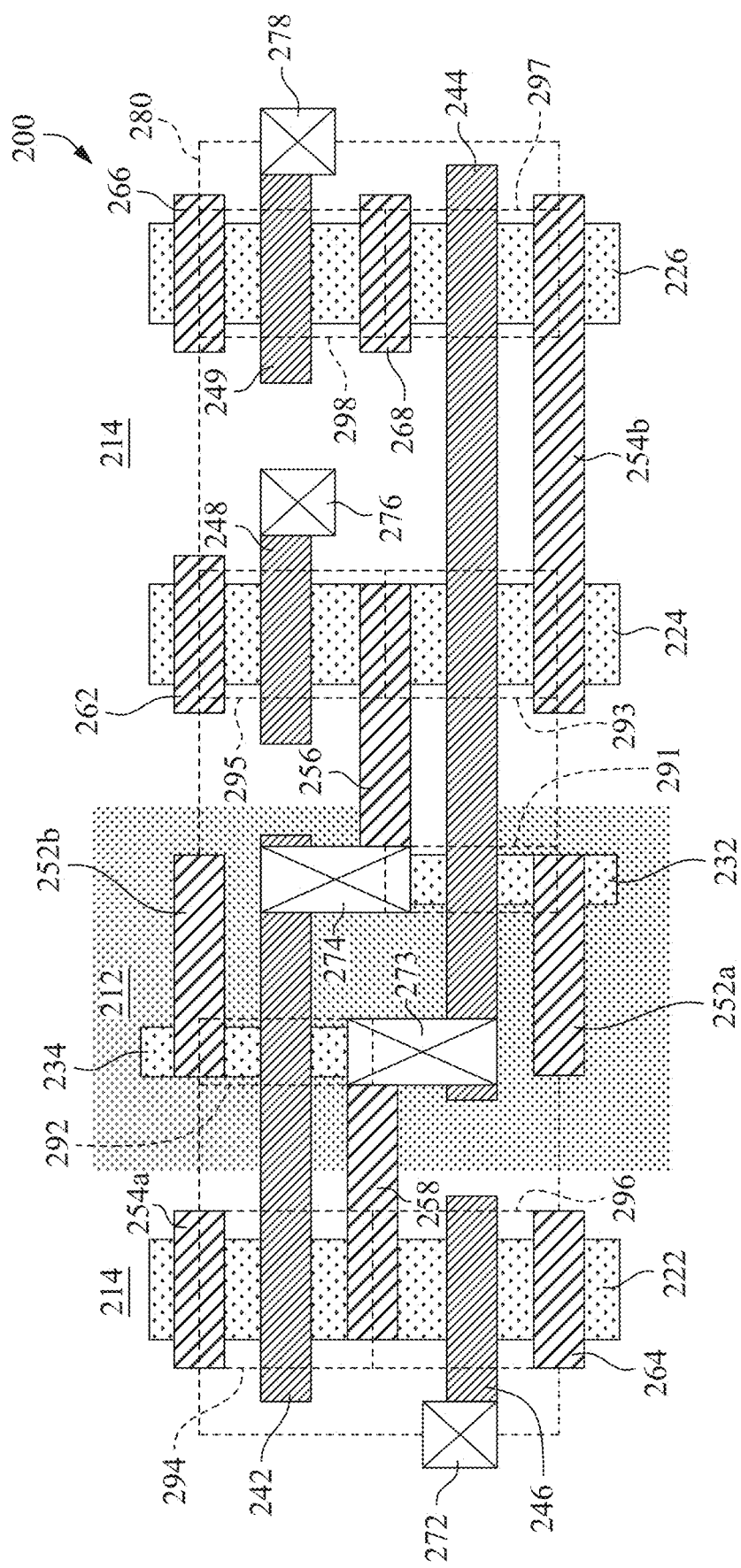
FIG. 2 is a layout diagram of a memory cell in accordance with some embodiments.

FIG. 2 is a layout diagram 200 of a memory cell in accordance with some embodiments. The memory cell in FIG. 2 is based on memory cell 110A[0] in FIG. 1 and is usable to illustrate layout designs of memory cells 110A[0], 110B[0], 110A[1], and 110B[1].

Layout diagram 200 includes an N-well region 212 and a P substrate or P-well region 214 (hereinafter "P-well region"). Layout diagram 200 further includes oxide-definition (OD) regions 222, 224, and 226 indicating N-type implantation regions buried in P-well region 214, and OD regions 232 and 234 indicating P-type implantation regions buried in N-well region 212.

Layout diagram 200 also includes polysilicon regions 242, 244, 246, 248, and 249, interconnection regions 252a, 252b, 254a, 254b, 256, 258, 262, 264, 266, and 268, and interconnection regions 272, 273, 274, 276, and 278. Interconnection regions 252a, 252b, 254a, 254b, 256, 258, 262, 264, 266, and 268 correspond to conductive structures of a common layer. Interconnection regions 272, 273, 274, 276, and 278 correspond to conductive structures of another common layer.

Within a cell boundary 280, interconnection region 252a, polysilicon region 244, OD region 232, and interconnection region 256 define a transistor 291 corresponding to transistor 122 in FIG. 1. Polysilicon region 244 corresponds to the gate of transistor 122, interconnection region 252a corresponds to power supply node 152, and interconnection region 256 corresponds to data node MT. Interconnection region 252b, polysilicon region 242, OD region 234, and interconnection region 258 define a transistor 292 corresponding to transistor 124. Polysilicon region 242 corresponds to the gate of transistor 124, interconnection region 242b corresponds to power supply node 152, and interconnection region 258 corresponds to data node MB. Interconnection region 273 connects interconnection regions 258 and polysilicon region 244. Interconnection region 274 connects interconnection regions 256 and polysilicon region 242.

Interconnection region 254b, polysilicon region 244, OD region 224, and interconnection region 256 define a transistor 293 corresponding to transistor 132. Polysilicon region 244 corresponds to the gate of transistor 132, and interconnection region 254b corresponds to power supply node 154. Interconnection region 254a, polysilicon region 242, OD region 222, and interconnection region 258 define a transistor 294 corresponding to transistor 134. Polysilicon region 242 corresponds to the gate of transistor 134, and interconnection region 254a corresponds to power supply node 154.

Interconnection region 262, polysilicon region 248, OD region 224, and interconnection region 256 define a transistor 295 corresponding to transistor 142 in FIG. 1. Polysilicon region 248 corresponds to the gate of transistor 142, and interconnection region 262 corresponds to a node to be connected with write bit line WBL. Interconnection region 264, polysilicon region 246, OD region 222, and interconnection region 258 define a transistor 296 corresponding to transistor 144. Polysilicon region 246 corresponds to the gate of transistor 144, and interconnection region 264 corresponds to a node to be connected with write bit line /WBL.

Interconnection region 268, polysilicon region 244, OD region 226, and interconnection region 254b define a transistor 297 corresponding to transistor 146 in FIG. 1. Polysilicon region 244 corresponds to the gate of transistor 146, and interconnection region 268 corresponds to the drain of transistor 146. Interconnection region 266, polysilicon region 249, OD region 226, and interconnection region 268 define a transistor 298 corresponding to transistor 148. Polysilicon region 249 corresponds to the gate of transistor 148, and interconnection region 266 corresponds to a node to be connected with read bit line RBLA.

Interconnection region 276 corresponds to a conductive structure that is connected to the feature represented by polysilicon region 248 and is to be connected with a write word line WWLA[0]. Interconnection region 272 corresponds to a conductive structure that is connected to the feature represented by polysilicon region 246 and is to be connected with the write word line WWLA[0] as well. Interconnection region 278 corresponds to a conductive structure that is connected to the feature represented by polysilicon region 249 and is to be connected with a read word line RWL[0].

In some embodiments, in order to keep read/write stability, effective channel widths, such as device widths and/or the numbers of fin, of transistors 291 and 292 are less than those of other transistors 293-298.

Figure 3:
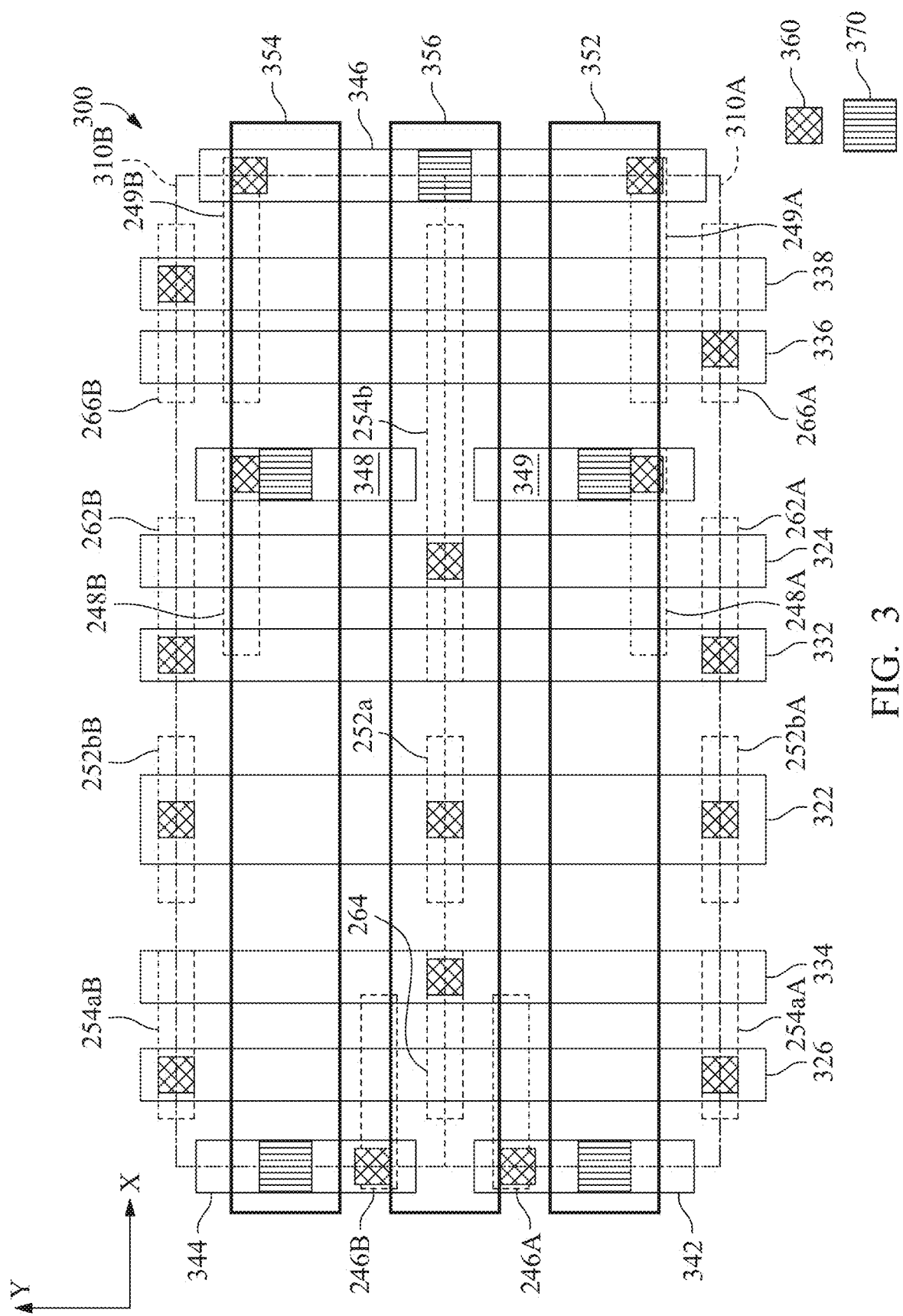
FIG. 3 is a layout diagram of a portion of a memory circuit in accordance with some embodiments.

FIG. 3 is a layout diagram 300 of a portion of a memory circuit in accordance with some embodiments. In some embodiments, the memory circuit depicted in FIG. 3 corresponds to the memory circuit 100 in FIG. 1. For example, layout diagram 300 depicts, with broken lines, the cell boundaries of two adjacent memory cells 310A and 310B. Memory cells 310A and 310B abut with each other along a column direction and correspond to memory cells 110A[0] and 110B[0] in FIG. 1.

Each memory cell of memory cells 310A and 310B has a layout design similar to the layout design depicted in layout diagram 200 (FIG. 2). Some polysilicon regions and interconnection regions of memory cells 310A and 310B are depicted with broken lines for facilitating the illustration of FIG. 3. The components in FIG. 3 that are the same or similar to those depicted in FIG. 2 are giving the same reference labels, plus denotation "A" for memory cell 310A and denotation "B" for memory cell 310B. The detailed description thereof is thus omitted.

Layout diagram 300 includes interconnection regions 322, 324, 326, 332, 334, 336, 338, 342, 344, 346, 348, 349, 352, 354, and 356. Interconnection regions 322, 324, 326, 332, 334, 336, 338, 342, 344, 346, 348, and 349 correspond to conductive structures of a common layer. Interconnection regions 352, 354, and 356 correspond to conductive structures of another common layer. In the embodiment depicted in FIG. 3, interconnection regions 352, 354, and 356 correspond to conductive structures of a conductive layer above that of interconnection regions 322, 324, 326, 332, 334, 336, 338, 342, 344, 346, 348, and 349.

Layout diagram 300 further includes via plug regions 360 and 370. Via plug regions 360 corresponds to via plug structures of a common layer between the conductive structures represented by interconnection regions depicted in layout diagram 200 and the conductive layer represented by interconnection regions 322, 324, 326, 332, 334, 336, 338, 342, 344, 346, 348, and 349. Via plug regions 370 corresponds to via plug structures of another common layer between the conductive layer represented by interconnection regions 322, 324, 326, 332, 334, 336, 338, 342, 344, 346, 348, and 349 and the conductive layer represented by interconnection regions 352, 354, and 356.

Interconnection region 322 corresponds to a conductive structure extending along a column direction Y. The conductive structure represented by interconnection region 322 is electrically connected to conductive structures represented by interconnection regions 252a, 252bA, and 252bB through corresponding via plugs represented by via plug regions 360. The conductive structure represented by interconnection region 322 is configured to receive a first power supply voltage VDD (not labeled). Interconnection regions 324 and 236 correspond to conductive structures extending along column direction Y. The conductive structure represented by interconnection region 324 is electrically connected to a conductive structure represented by interconnection region 254b through a corresponding via plug represented by a via plug region 360. The conductive structure represented by interconnection region 326 is electrically connected to conductive structures represented by interconnection regions 254aA and 254aB through corresponding via plugs represented by via plug regions 360. The conductive structure represented by interconnection region 322 is configured to receive a second power supply voltage VSS (not labeled).

Interconnection regions 332 and 334 correspond to conductive structures extending along column direction Y. The conductive structure represented by interconnection region 332 is electrically connected to conductive structures represented by interconnection regions 262A, and 262B through corresponding via plugs represented by via plug regions 360. The conductive structure represented by interconnection region 332 corresponds to write bit line WBL. The conductive structure represented by interconnection region 334 is electrically connected to a conductive structure represented by interconnection region 264 through a corresponding via plug represented by a via plug region 360. The conductive structure represented by interconnection region 334 corresponds to write bit line /WBL.

Interconnection regions 336 and 338 correspond to conductive structures extending along column direction Y. The conductive structure represented by interconnection region 336 is electrically connected to a conductive structure represented by interconnection region 266A through a corresponding via plug represented by a via plug region 360. The conductive structure represented by interconnection region 336 corresponds to read bit line RBLA. The conductive structure represented by interconnection region 338 is electrically connected to a conductive structure represented by interconnection region 266B through a corresponding via plug represented by a via plug region 360. The conductive structure represented by interconnection region 338 corresponds to read bit line RBLB.

Interconnection regions 342 and 349 correspond to conductive structures connecting polysilicon structures represented by polysilicon regions 246A and 248A with a conductive structure represented by interconnection region 352 through various corresponding via structures. Interconnection regions 344 and 348 correspond to conductive structures connecting polysilicon structures represented by polysilicon regions 246B and 248B with a conductive structure represented by interconnection region 354 through various corresponding via structures. Interconnection region 346 corresponds to a conductive structure connecting polysilicon structures represented by polysilicon regions 249A and 249A with a conductive structure represented by interconnection region 356 through various corresponding via structures.

Interconnection regions 352, 354, and 356 correspond to conductive structures extending along row direction X. The conductive structure represented by interconnection region 352 corresponds to write word line WWLA[0]. The conductive structure represented by interconnection region 354 corresponds to write word line WWLB[0]. The conductive structure represented by interconnection region 356 corresponds to read word line RWL[0].

As depicted in FIG. 3, in each set of two adjacent rows, such as the row including memory cell 310A and the row including memory cell 310B, gates of read pass gate represented by polysilicon regions 249A and 249B are connected. Read bit lines for the two adjacent rows are separately provided as read bit line RBLA[0] and read bit line RBLB. In some embodiments, to reduce the resistance of the word lines, a width of interconnection regions 352, 354, and/or 356 (WWLA[0], WWLB[0], and RWL[0]) is wider than that of interconnection regions 332, 334, 336, and/or 338 (WBL, /WBL, RBLA, and RBLB).

In the embodiment depicted in FIG. 3, the order of word lines along column direction Y is, from the bottom to the top of the page, (1) write word line WWLA[0] (352); (2) the shared read word line RWL[0] (356); and (3) write word line WWLB[0] (354). In some embodiments, the resistance of WWLA[0], WWLB[0], and RWL[0] are adjustable. In some embodiments, if faster read access time is preferred, the line width of read word line RWL[0] is arranged to be wider than that of write word lines WWLA[0] and WWLB[0]. In some embodiments, if faster write cycle is preferred, the line width of write word lines WWLA[0] and WWLB[0] is arranged to be wider than that of read word line RWL[0].

Figure 4A:
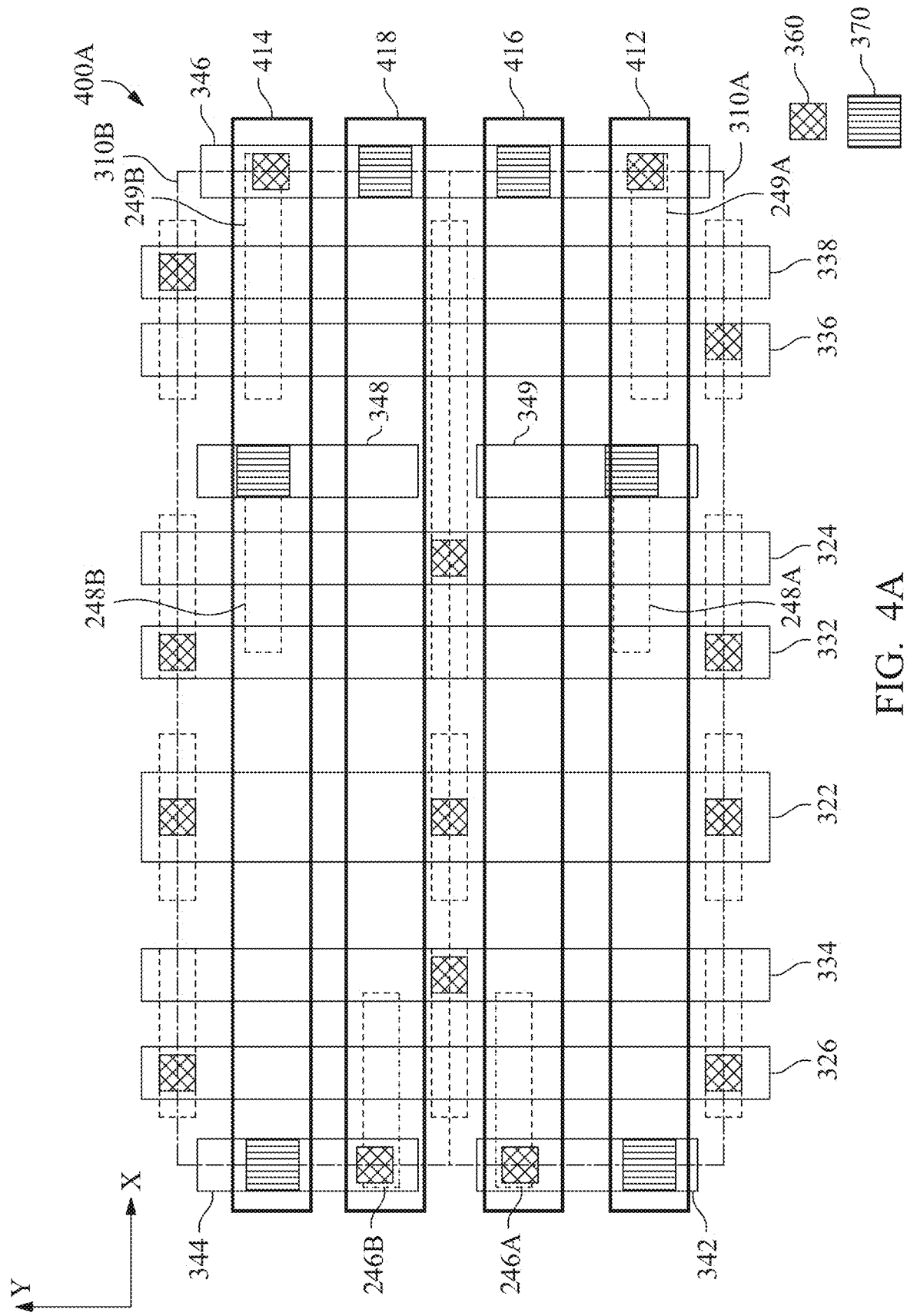
FIG. 4A-4C are layout diagrams of portions of various memory circuits in accordance with some embodiments.

FIG. 4A is a layout diagram 400A of a portion of a memory circuit in accordance with some embodiments. In some embodiments, the memory circuit depicted in FIG. 4A corresponds to the memory circuit 100 in FIG. 1. The components in FIG. 4A that are the same or similar to those depicted in FIG. 3 are giving the same reference labels, and the detailed description thereof is omitted.

Layout diagram 400A includes interconnection regions 412, 414, 416, and 418 corresponding to conductive structures extending along row direction X. The conductive structure represented by interconnection region 412 corresponds to write word line WWLA[0]. The conductive structure represented by interconnection region 414 corresponds to write word line WWLB[0]. The conductive structures represented by interconnection regions 416 and 418 correspond to read word line RWL[0].

Interconnection regions 342 and 349 correspond to conductive structures connecting polysilicon structures represented by polysilicon regions 246A and 248A with a conductive structure represented by interconnection region 412 through various corresponding via structures. Interconnection regions 344 and 348 correspond to conductive structures connecting polysilicon structures represented by polysilicon regions 246B and 248B with a conductive structure represented by interconnection region 414 through various corresponding via structures. Interconnection region 346 corresponds to a conductive structure connecting polysilicon structures represented by polysilicon regions 249A and 249A with conductive structures represented by interconnection regions 416 and 418 through various corresponding via structures.

Thus, compared with layout diagram 300 in FIG. 3, the shared read word line RWL[0] has two conductive lines represented by interconnection regions 416 and 418. The two conductive lines represented by interconnection regions 416 and 418 are electrically shorted by a conductive line represented by interconnection region 346 to effectively lower the resistance of the shared read word line RWL[0].

In the embodiment depicted in FIG. 4A, the order of word lines along column direction Y is, from the bottom to the top of the page, (1) write word line WWLA[0] (412); (2) a first line of the shared read word line RWL[0] (416); (3) a second line of the shared read word line RWL[0] (418); and (4) write word line WWLB[0] (414). In some embodiments, the resistance of WWLA[0], WWLB[0], and RWL[0] depends on their corresponding line widths and are thus adjustable as illustrated in conjunction with FIG. 3.

Figure 4B:
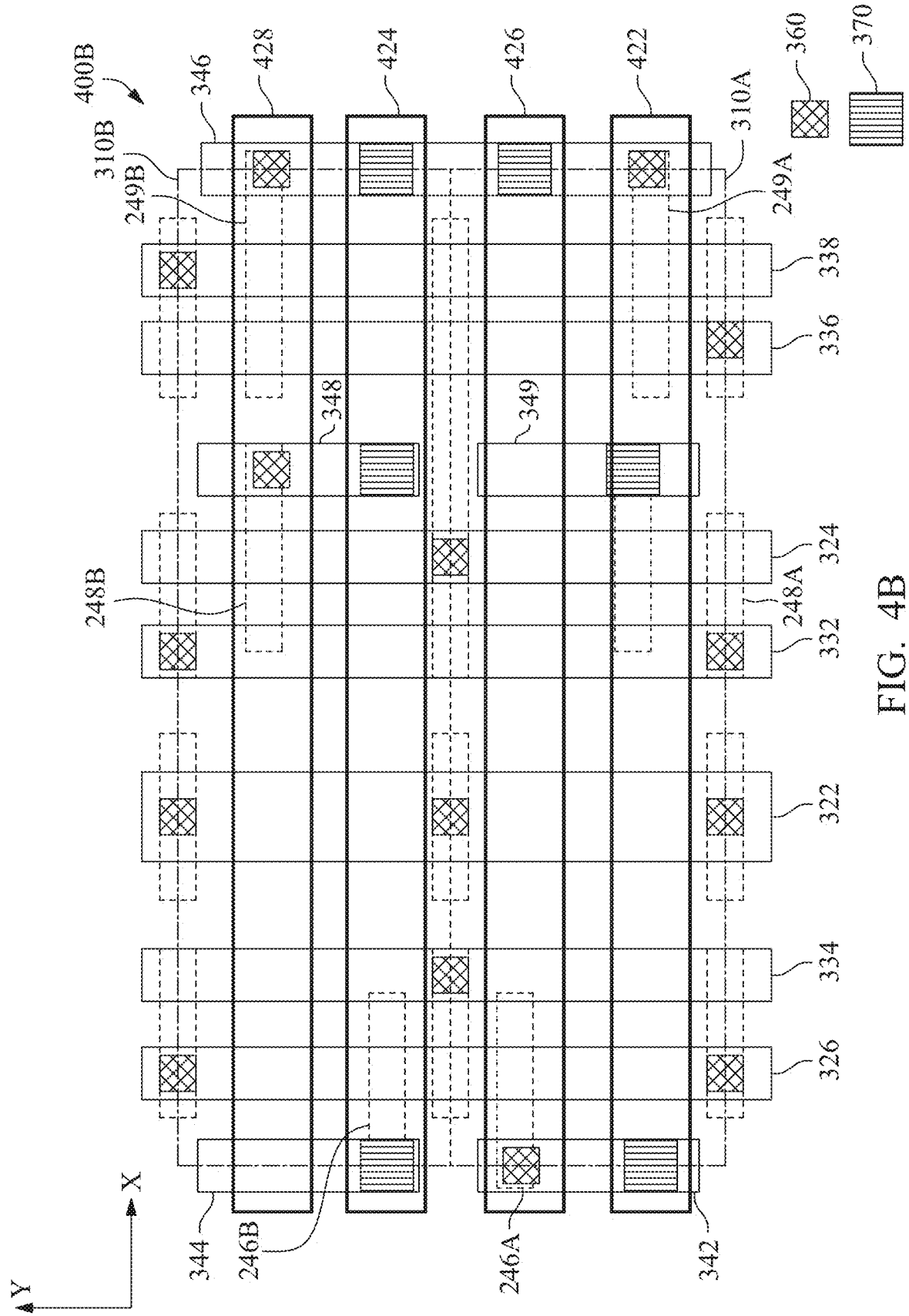

FIG. 4B is a layout diagram 400B of a portion of a memory circuit in accordance with some embodiments. In some embodiments, the memory circuit depicted in FIG. 4B corresponds to the memory circuit 100 in FIG. 1. The components in FIG. 4B that are the same or similar to those depicted in FIG. 4A are giving the same reference labels, and the detailed description thereof is omitted.

Layout diagram 400B includes interconnection regions 422, 424, 426, and 428 corresponding to interconnection regions 412, 414, 416, and 418 in FIG. 4A. The conductive structure represented by interconnection region 422 corresponds to write word line WWLA[0]. The conductive structure represented by interconnection region 424 corresponds to write word line WWLB[0]. The conductive structures represented by interconnection regions 426 and 428 correspond to read word line RWL[0].

In the embodiment depicted in FIG. 4B, the order of word lines along column direction Y is, from the bottom to the top of the page, (1) write word line WWLA[0] (422); (2) a first line of the shared read word line RWL[0] (426); (3) write word line WWLB[0] (424); and (4) a second line of the shared read word line RWL[0] (428).

Compared with layout diagram 400A, the via plugs (as represented by via plug regions 370) connecting the conductive structure represented by interconnection region 346 with those represented by interconnection regions 426 and 428 (i.e., read word line RWL[0]) are further separated apart. Therefore, the minimum VIA1-VIA1 space for via plug regions 370 in FIG. 4B is greater than that in FIG. 4A. As a result, layout diagram 400B is more likely to comply with various design rules of corresponding technology nodes than layout diagram 400B.

Figure 4C:
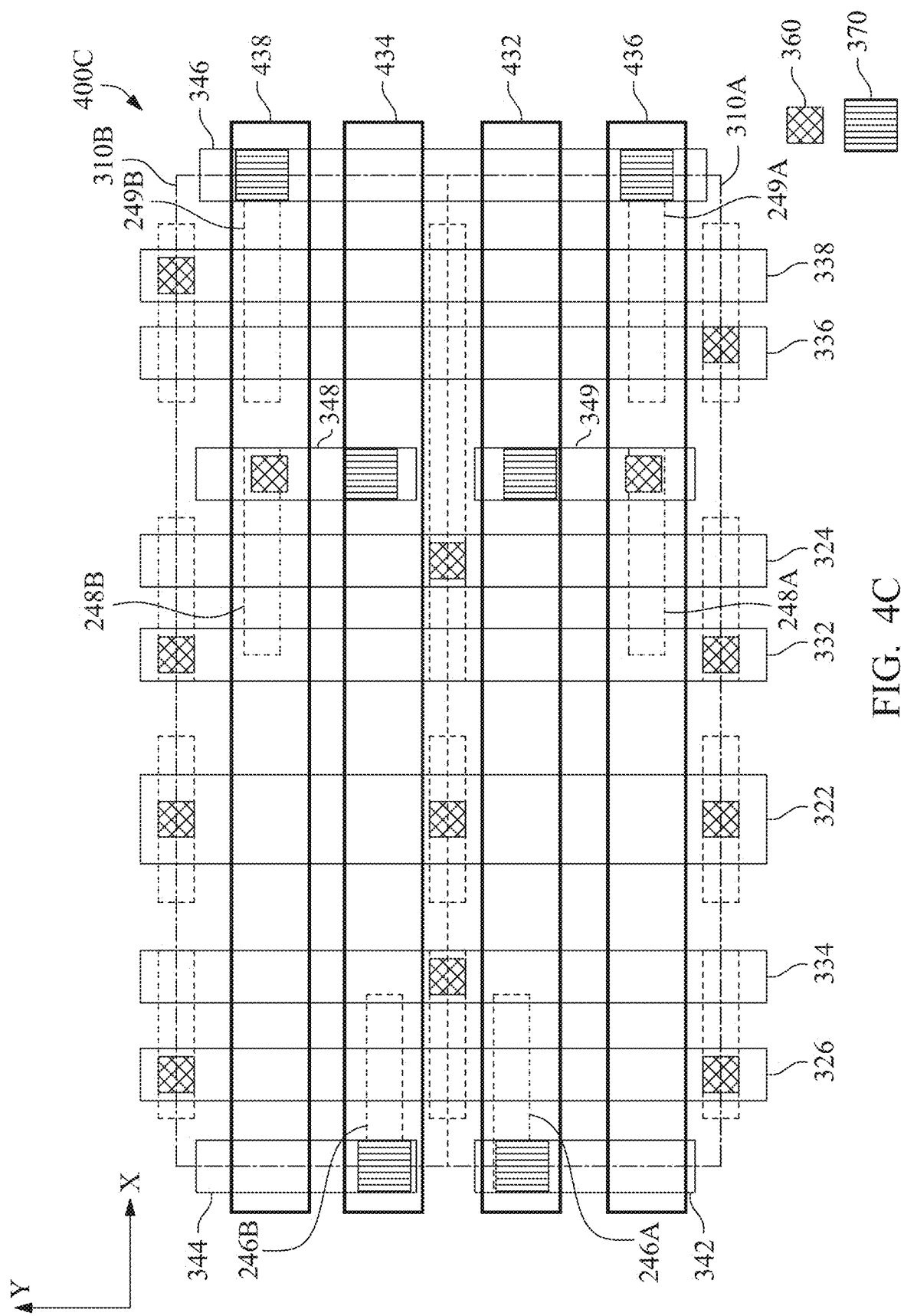

FIG. 4C is a layout diagram 400C of a portion of a memory circuit in accordance with some embodiments. In some embodiments, the memory circuit depicted in FIG. 4C corresponds to the memory circuit 100 in FIG. 1. The components in FIG. 4C that are the same or similar to those depicted in FIG. 4A are giving the same reference labels, and the detailed description thereof is omitted.

Layout diagram 400C includes interconnection regions 432, 434, 436, and 438 corresponding to interconnection regions 412, 414, 416, and 418 in FIG. 4A. The conductive structure represented by interconnection region 432 corresponds to write word line WWLA[0]. The conductive structure represented by interconnection region 434 corresponds to write word line WWLB[0]. The conductive structures represented by interconnection regions 436 and 438 correspond to read word line RWL[0].

In the embodiment depicted in FIG. 4C, the order of word lines along column direction Y is, from the bottom to the top of the page, (1) a first line of the shared read word line RWL[0] (436); (2) write word line WWLA[0] (432); (3) write word line WWLB[0] (434); and (4) a second line of the shared read word line RWL[0] (438).

Figure 5:
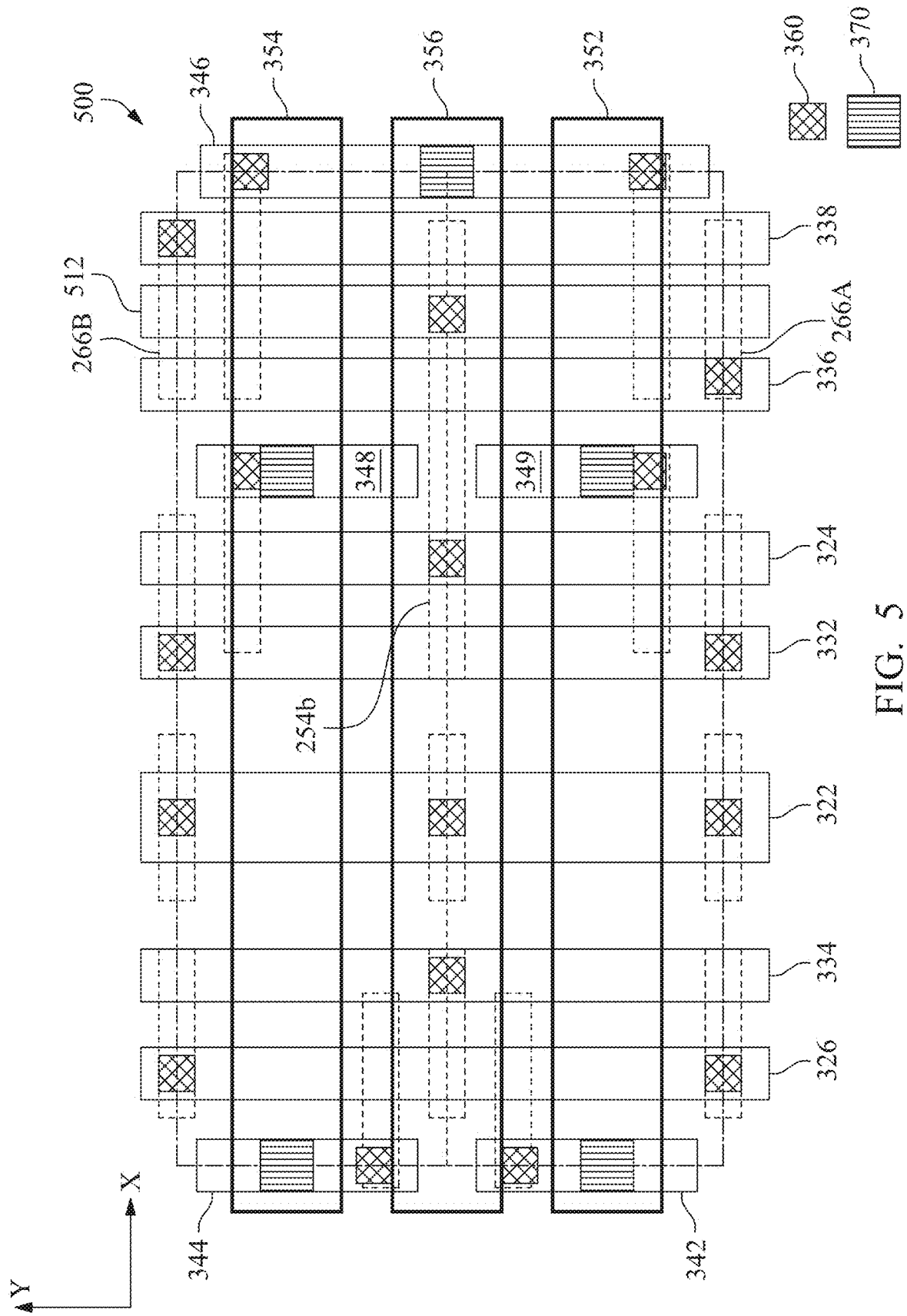
FIG. 5 is a layout diagram of a portion of memory circuit in accordance with some embodiments.

FIG. 5 is a layout diagram 500 of a portion of memory circuit in accordance with some embodiments. In some embodiments, the memory circuit depicted in FIG. 5 corresponds to the memory circuit 100 in FIG. 1. The components in FIG. 5 that are the same or similar to those depicted in FIG. 3 are giving the same reference labels, and the detailed description thereof is omitted.

Layout diagram 500 further includes an interconnection region 512 corresponding to a conductive structure extending along column direction Y. The conductive structure represented by interconnection region 512 corresponds to a shielding line electrically coupled to the second power supply voltage VSS through the conductive structure represented by interconnection region 254b. The shielding line (512) is between read bit lines RBLA (336) and RBLB (338) and is capable of reducing or illuminating coupling noises between read bit lines RBLA and RBLB.

Figure 6A:
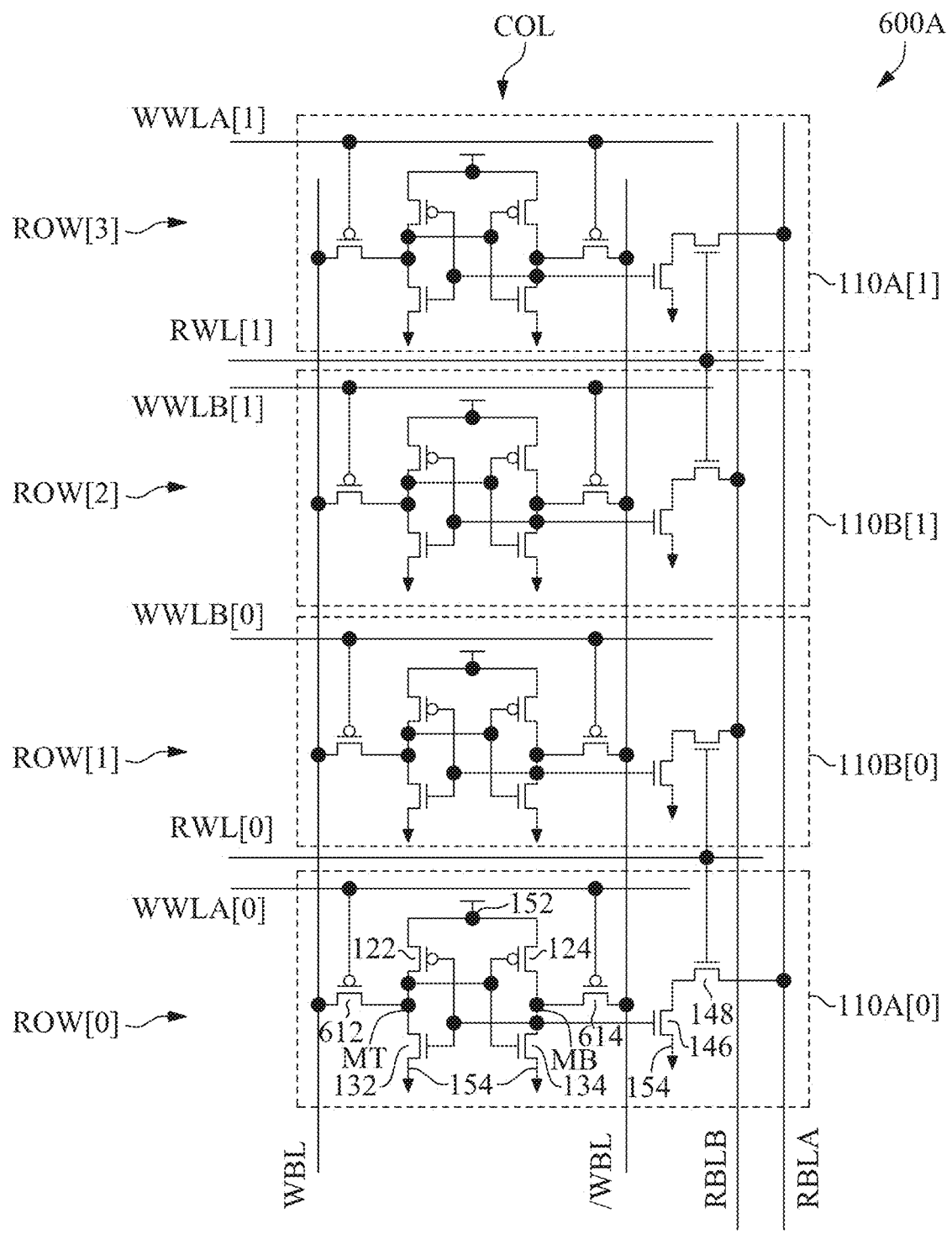
FIG. 6A-6B are circuit diagrams of portions of various memory circuits in accordance with some embodiments.

FIG. 6A is a circuit diagram of a portion of a memory circuit 600A in accordance with some embodiments. The components in FIG. 6A that are the same or similar to those depicted in FIG. 1 are giving the same reference labels, and the detailed description thereof is omitted.

Compared with memory circuit 100 in FIG. 1, N-type transistors 142 and 144 are replaced by P-type transistors 612 and 614. Therefore, the write pass gates of memory circuit 600A are P-type transistors instead of N-type transistors.

Figure 6B:
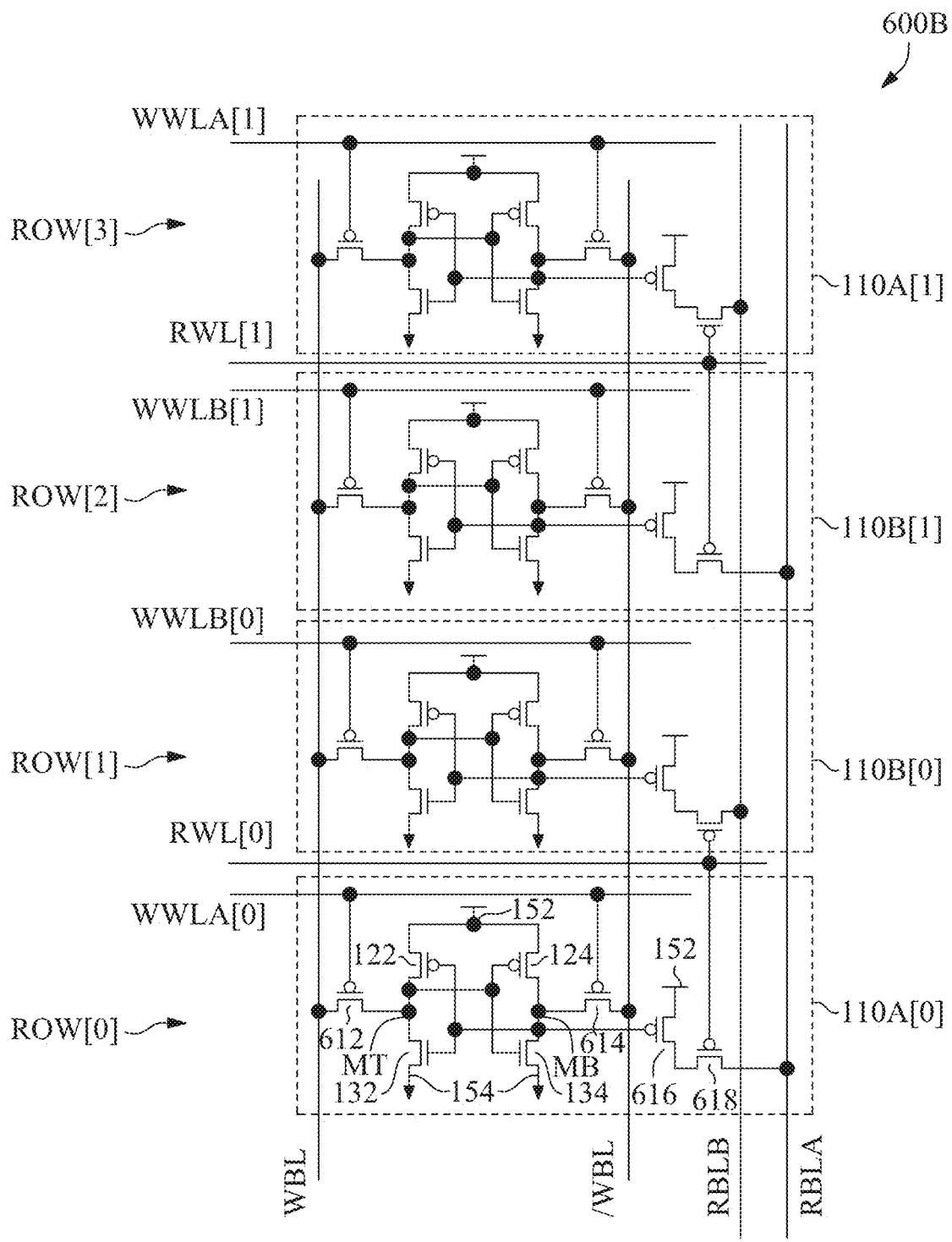

FIG. 6B is a circuit diagram of a portion of a memory circuit 600B in accordance with some embodiments. The components in FIG. 6B that are the same or similar to those depicted in FIG. 1 are giving the same reference labels, and the detailed description thereof is omitted.

Compared with memory circuit 100 in FIG. 1, N-type transistors 142 and 144 are replaced by P-type transistors 612 and 614. Moreover, N-type transistors 146 and 148 are further replaced by P-type transistors 616 and 618. Transistor 616 has a source coupled to power supply node 152, a gate coupled to data node MB, and a drain coupled to transistor 618. Transistor 618 is coupled between read bit line RBLA and the drain of transistor 616. Transistor 618 functions as a read pass gate controlled by read word line RWL[0].

Figure 7:
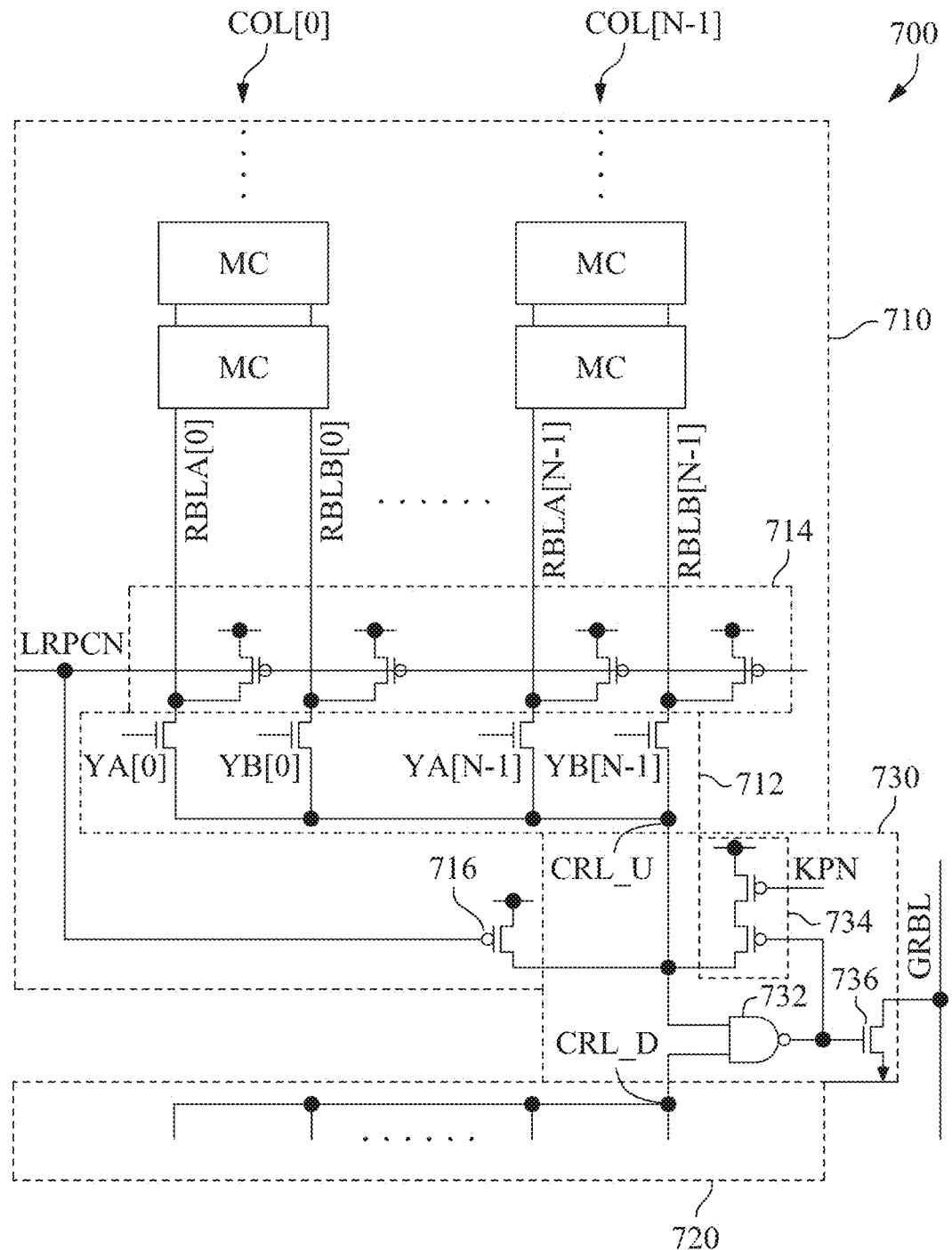
FIG. 7 is a circuit diagram of a portion of a memory circuit in accordance with some embodiments.

FIG. 7 is a circuit diagram of a portion of a memory circuit 700 in accordance with some embodiments. Memory circuit 700 includes a plurality of memory cells MC arranged into columns of memory cells and rows of memory cells. Each column of memory cells has an arrangement similar to that depicted in FIG. 1. For example, memory circuit 700 includes an upper section 710 and a lower section 720. The upper section 710 includes N columns COL[0] . . . COL[N] of memory cells MC, where N is a positive integer. In some embodiments, N ranges from 1 to 31. Each column COL[0] or COL[N] corresponds to the column COL in FIG. 1 and is coupled with corresponding read bit lines RBLA[0] and RBLB[0], or bit lines RBLA[N−1] and RBLB[N−1]. Each memory cell MC corresponds to memory cell 110A[0]. The configuration and operation of memory cells and corresponding read bit lines are similar to those illustrated above with regard to memory circuit 100, and the detailed description thereof is thus omitted.

Memory circuit 700 further includes a local read out circuit 730 configured to output read data from an accessed memory cell in upper section 710 or lower section 720 to a global read bit line GRBL. Upper section 710 of memory circuit 700 further includes a multiplexer unit 712, a first pre-charge circuit 714, a second pre-charge circuit 716, and an output node CRL_U. Upper section 710 is coupled with local read out circuit 730 at output node CRL_U.

Read bit lines RBLA[0:N−1] and read bit lines RBLB[0:N−1] are coupled to multiplexer unit 712. Multiplexer unit 712 has N selection switches controlled by signals YA[0:N−1] and YB[0:N−1] and is configured to selectively couple one of the plurality of bit lines RBLA[0:N−1] and RBLB[0:N−1] to the local read amplifier 730 through output node CRL_U.

First pre-charge circuit 714 includes a plurality of switches and is configured to charge, responsive to control signal LRPCN, read bit lines RBLA[0:N−1] and RBLB[0:N−1] to a predetermined voltage level, such as the first supply voltage level VDD, during a pre-charge stage. Second pre-charge circuit 716 is configured to charge, responsive to control signal LRPCN, output node CRL_U to the predetermined voltage level during the pre-charge stage.

Lower section 720 of memory circuit 700 has a configuration similar to that of upper section 710, including an output node CRL_D corresponding to output node CRL_U. Detailed description of lower section 720 of memory circuit 700 is thus omitted.

Local read out circuit 730 includes a local read amplifier 732, a keeper circuit 734 coupled to the local read amplifier 732, and a pulling device 736. Local read amplifier 732 is configured to selectively turn on pulling device 736 responsive to voltage levels at output nodes CRL_U and CRL_D. In some embodiments, global read bit line GRBL is pre-charged to a first predetermined voltage level, such as the first supply voltage level VDD. Keeper circuit 734 is enabled by control signal KPN to maintain the voltage level at global read bit line GRBL at about the first supply voltage level VDD. When the voltage level at one of output nodes CRL_U and CRL_D corresponds to a logical low level, local read amplifier 732 turns on pulling device 736 to pull a voltage level at global read bit line GRBL to a second predetermined voltage level, such as the second supply voltage level VSS.

In some embodiments, by sharing the local read out circuit 730 among read bit lines of upper and lower sections 710 and 720 of memory circuit 700, an area otherwise would be occupied by additional local read out circuit is thus saved.

Figure 8:
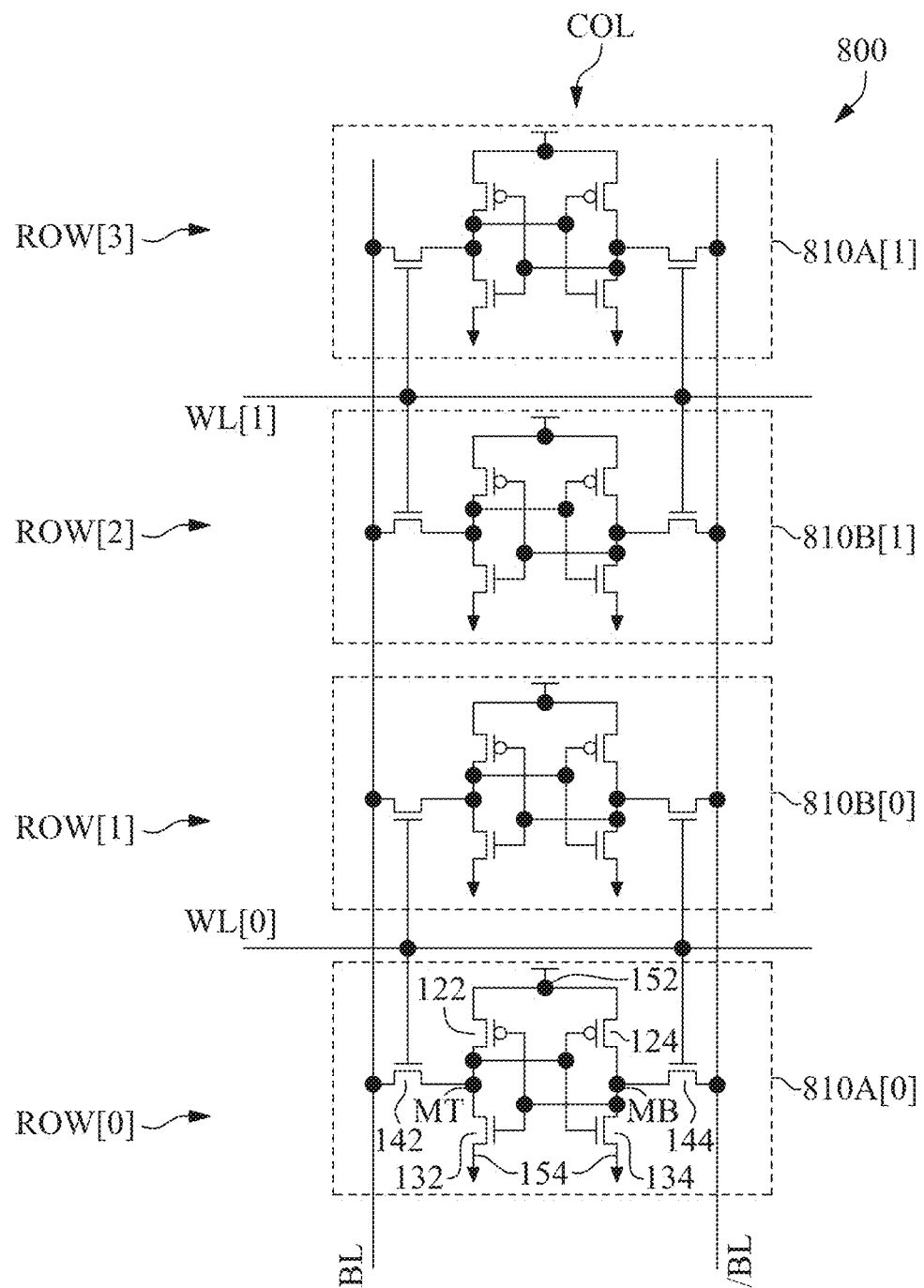
FIG. 8 is a circuit diagram of a portion of a memory circuit in accordance with some embodiments.

FIG. 8 is a circuit diagram of a portion of a memory circuit 800 in accordance with some embodiments. Memory circuit 800 includes a plurality of memory cells arranged into columns and one or more pairs of adjacent rows. For example, FIG. 8 depicts that memory circuit 800 includes memory cells 810A[0], 810B[0], 810A[1], and 810B[1], which belong to a column COL. Also, memory cell 810A[0] belongs to a first row ROW[0]; memory cell 810B[0] belongs to a second row ROW[1]; memory cell 810A[1] belongs to a third row ROW[2]; and memory cell 810B[1] belongs to a fourth row ROW[3]. In some embodiments, memory circuit 800 includes two or more columns of memory cells. In some embodiments, memory circuit 800 includes four or more rows of memory cells.

Memory cells 810A[0], 810B[0], 810A[1], and 810B[1] are single-port SRAM cells. Each of memory cells 810A[0], 810B[0], 810A[1], and 810B[1] have configuration similar to memory cell 110A[0] in FIG. 1, except transistors 146 and 146 are omitted. Components in memory cells 810A[0], as a representative memory cell, that are the same or similar to those in memory cell 110A[0] are given the same reference numbers, and detailed description thereof is thus omitted.

For example, memory cell 810A[0] includes two P-type transistors 122 and 124 and two N-type transistors 132 and 134 forming a storage unit, and another two N-type transistors 142 and 144 function as pass gates of the access port of memory cell 810A[0]. The access port is further associated with word line WL[0] and bit lines BL and /BL. During a write operation, transistors 142 and 144 are configured to transfer the voltage level on bit lines BL and /BL to corresponding data node MT and MB if transistors 142 and 144 are turned on. During a read operation, transistors 142 and 144 are configured to selectively alter voltage levels at access nodes 162 and 164 according to voltage levels at the data nodes MT and MB if transistor 142 and 144 are turned on.

Pass gates of adjacent rows of memory cells are electrically coupled together. For example, pass gates of memory cells at row ROW[0], such as memory cell 810A[0], and pass gates of memory cells at row ROW[1], such as memory cell 810B[0], are coupled to word line WL[0]. Pass gates of memory cells at row ROW[2], such as memory cell 810B[1], and pass gates of memory cells at row ROW[3], such as memory cell 810A[1], are coupled to word line WL[1].

Therefore, for the space corresponding to two rows of memory cells, there is only one electrically distinct word line. In some embodiments, the implementation of the word line, such as WL[0] for two adjacent rows of memory cells, such as row ROW[0] and RWO[1], includes utilizing one conductive line, or plurality of shorted conductive lines. In FIG. 8, because of the shared word line and bit lines, two adjacent rows of memory cells function as one row of memory cells. The word lines are capable of being arranged to have lower resistance in comparison with a memory circuit without sharing the word lines. As a result, the arrangement as illustrated in FIG. 8 is capable of implementing a faster memory circuit at the cost of duplicated area penalty.

Figure 9:
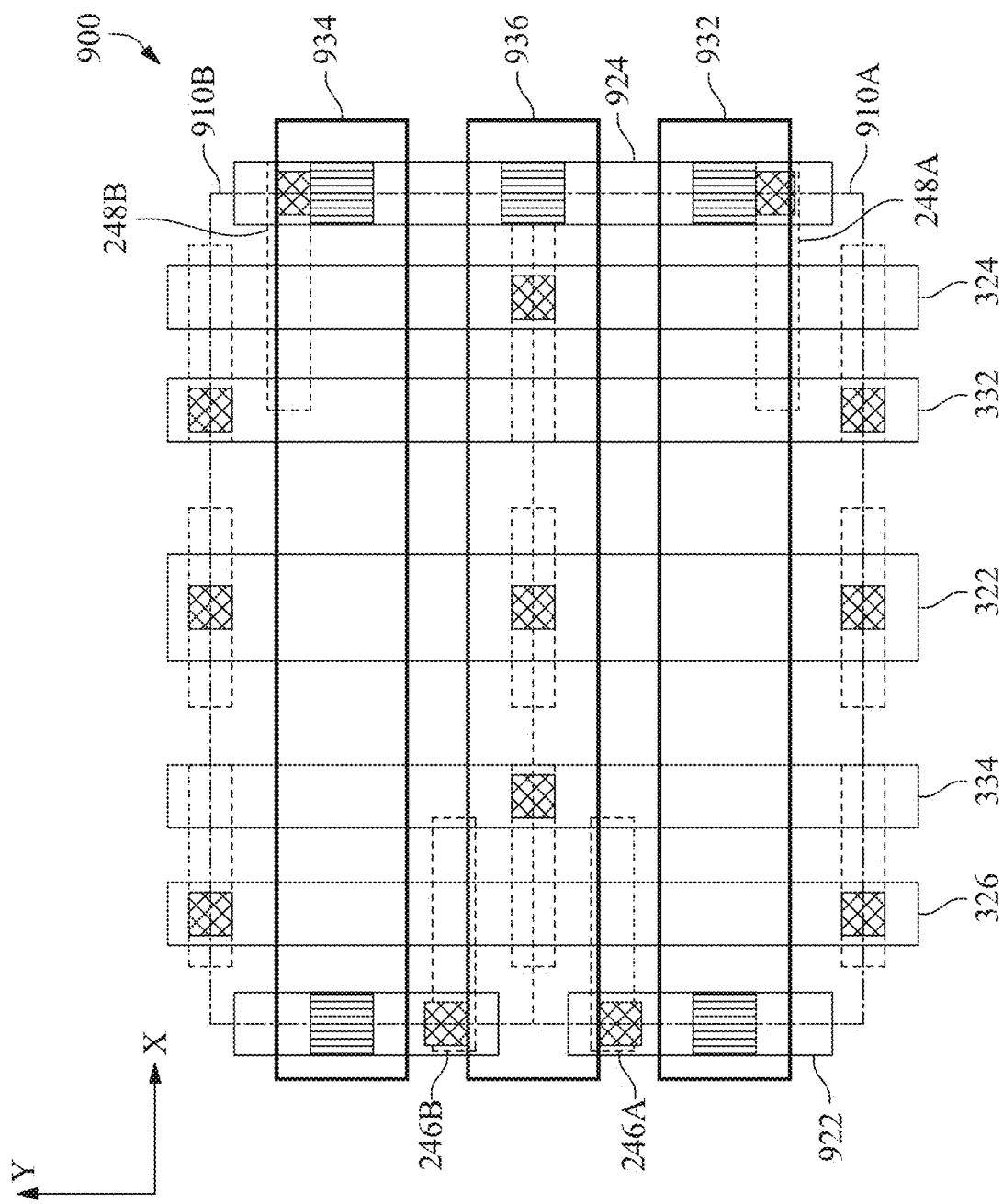
FIG. 9 is a layout diagram of a portion of a memory circuit in accordance with some embodiments.

FIG. 9 is a layout diagram 900 of a portion of a memory circuit in accordance with some embodiments. In some embodiments, the memory circuit depicted in FIG. 9 corresponds to the memory circuit 800 in FIG. 8. Memory cells 910A and 910B abut with each other along a column direction and correspond to memory cells 810A[0] and 810B[0] in FIG. 8. Moreover, in view of the similarity between memory cell 810A[0] and 110A[0], the components in FIG. 9 that are the same or similar to those depicted in FIG. 3 are giving the same reference labels, and the detailed description thereof is omitted.

Layout diagram 900 includes interconnection regions 322, 324, 326, 332, and 334 similar to the corresponding interconnection regions illustrated in conjunction with FIG. 3. Layout diagram 900 further includes interconnection regions 922, 924, 932, 934, and 936. Interconnection regions 322, 324, 326, 332, 334, 922, and 924 correspond to conductive structures of a common layer. Interconnection regions 932, 934, and 936 correspond to conductive structures of another common layer.

Interconnection regions 922 and 924 correspond to conductive structures connecting polysilicon structures represented by polysilicon regions 246A, 246B, 248A and 248B with conductive structures represented by interconnection regions 932, 934, and 936 through various corresponding via structures. The conductive structure represented by interconnection region 332 corresponds to bit line BL. The conductive structure represented by interconnection region 334 corresponds to bit line /BL.

In the embodiment depicted in FIG. 9, the entire cell height along column direction Y of two rows of memory cells are usable to accommodate three conductive lines (932, 934, and 936), which are shorted together and function as a word line WL[0]. Thus, the unit-length resistance of word line WL[O] is significantly reduced.

In some embodiments, a circuit includes a column of memory cells, a first read data line coupled exclusively with a first subset of memory cells of the column of memory cells, a second read data line coupled exclusively with a second subset of memory cells of the column of memory cells, and a plurality of read word lines. Each read word line of the plurality of read word lines is coupled with a memory cell of the first subset of memory cells and with a memory cell of the second subset of memory cells.

In some embodiments, a memory circuit includes a column of memory cells, wherein a first subset of memory cells of the column of memory cells alternates with a second subset of memory cells of the column of memory cells, a plurality of read word lines, wherein each read word line of the plurality of read word lines is coupled with a memory cell of the first subset of memory cells and with an adjacent memory cell of the second subset of memory cells, a read amplifier, and a multiplexer unit configured to selectively couple either the first subset of memory cells or the second subset of memory cells to the read amplifier.

In some embodiment, a memory circuit includes a column of memory cells, wherein a first subset of memory cells of the column of memory cells alternates with a second subset of memory cells of the column of memory cells, a plurality of read word lines, wherein each read word line of the plurality of read word lines is coupled with first and second pass gates of a memory cell of the first subset of memory cells and with first and second pass gates of an adjacent memory cell of the second subset of memory cells, a first read data line coupled with the first pass gates of the first and second subsets of memory cells, and a second read data line coupled with the second pass gates of the first and second subsets of memory cells.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a column of memory cells;
   a first read data line coupled exclusively with a first subset of memory cells of the column of memory cells;
   a second read data line coupled exclusively with a second subset of memory cells of the column of memory cells;
   a plurality of read word lines,
   wherein each read word line of the plurality of read word lines is coupled with a memory cell of the first subset of memory cells and with a memory cell of the second subset of memory cells;
   wherein each memory cell of the column of memory cells includes a pass gate, and each read word line of the plurality of read word lines is configured to control the pass gate of the corresponding memory cell of the first subset of memory cells and the pass gate of the corresponding memory cell of the second subset of memory cells; and
   wherein the pass gate of each corresponding memory cell of the first and second subsets of memory cells is one of eight transistors included in the corresponding memory cell.

2. The circuit of claim 1, wherein
   the pass gate of the corresponding memory cell of the first subset of memory cells is configured to selectively couple the corresponding memory cell of the first subset of memory cells with the first read data line, and
   the pass gate of the corresponding memory cell of the second subset of memory cells is configured to selectively couple the corresponding memory cell of the second subset of memory cells with the second read data line.

3. The circuit of claim 1, wherein each pass gate comprises a P-type transistor.

4. The circuit of claim 1, wherein
   the column of memory cells is one column of a plurality of columns of memory cells,
   each column of the plurality of columns of memory cells comprises a corresponding first subset of memory cells coupled exclusively with a corresponding first read data line and a corresponding second subset of memory cells coupled exclusively with a corresponding second read data line, and
   each read word line of the plurality of read word lines is coupled with a corresponding memory cell of each first subset of memory cells and with a corresponding memory cell of each second subset of memory cells.

5. The circuit of claim 4, further comprising a multiplexer unit configured to selectively couple an output node with one of the first read data line or the second read data line corresponding to one column of the plurality of columns of memory cells.

6. The circuit of claim 5, further comprising a local read out circuit coupled with the output node.

7. The circuit of claim 5, further comprising:
   a first pre-charge circuit configured to charge each first read data line and each second read data line corresponding to each column of the plurality of columns to a predetermined voltage level; and
   a second pre-charge circuit configured to charge the output node to the predetermined voltage level.

8. The circuit of claim 7, wherein the first pre-charge circuit and the second pre-charge circuit are responsive to a same control signal.

9. A memory circuit comprising:
   a column of memory cells, wherein a first subset of memory cells of the column of memory cells alternates with a second subset of memory cells of the column of memory cells;
   a plurality of read word lines, wherein each read word line of the plurality of read word lines is coupled with a memory cell of the first subset of memory cells and with an adjacent memory cell of the second subset of memory cells;

a read amplifier;

a multiplexer unit configured to selectively couple either the first subset of memory cells or the second subset of memory cells to the read amplifier;

wherein each memory cell of the column of memory cells includes a pass gate, and each read word line of the plurality of read word lines is configured to control the pass gate of the corresponding memory cell of the first subset of memory cells and the pass gate of the corresponding memory cell of the second subset of memory cells; and wherein the pass gate of each corresponding memory cell of the first and second subsets of memory cells is one of eight transistors included in the corresponding memory cell.

10. The memory circuit of claim 9, further comprising a keeper circuit coupled with an input to the read amplifier.

11. The memory circuit of claim 10, wherein the keeper circuit is responsive to an output of the read amplifier.

12. The memory circuit of claim 9, wherein
the column of memory cells is an upper column of memory cells,
the multiplexer unit is an upper multiplexer unit, and
the memory circuit further comprises:
a lower column of memory cells, wherein a first subset of memory cells of the lower column of memory cells alternates with a second subset of memory cells of the lower column of memory cells; and
a lower multiplexer unit configured to selectively couple either the first subset of memory cells of the lower column of memory cells or the second subset of memory cells of the lower column of memory cells to the read amplifier.

13. The memory circuit of claim 12, wherein the read amplifier is responsive to voltage levels at output nodes of the upper column of memory cells and the lower column of memory cells.

14. The memory circuit of claim 13, wherein the read amplifier comprises a NAND gate.

15. The memory circuit of claim 13, wherein the read amplifier is configured to turn on a pulling device configured to pull a voltage level at a global read bit line to a predetermined voltage level.

16. The memory circuit of claim 9, further comprising:
a first read data line configured to couple the first subset of memory cells with the multiplexer unit; and
a second read data line configured to couple the second subset of memory cells with the multiplexer unit.

17. A memory circuit comprising:
a column of memory cells, wherein a first subset of memory cells of the column of memory cells alternates with a second subset of memory cells of the column of memory cells;
a plurality of read word lines, wherein each read word line of the plurality of read word lines is coupled with first and second pass gates of a memory cell of the first subset of memory cells and with first and second pass gates of an adjacent memory cell of the second subset of memory cells;
a first read data line coupled with the first pass gates of the first and second subsets of memory cells;
a second read data line coupled with the second pass gates of the first and second subsets of memory cells;
wherein each memory cell of the column of memory cells includes a pass gate, and each read word line of the plurality of read word lines is configured to control the pass gate of the corresponding memory cell of the first subset of memory cells and the pass gate of the corresponding memory cell of the second subset of memory cells; and
wherein the pass gate of each corresponding memory cell of the first and second subsets of memory cells is one of eight transistors included in the corresponding memory cell.

18. The circuit of claim 17, wherein each memory cell of the column of memory cells is a single-port memory cell.

* * * * *